United States Patent
Lee et al.

(10) Patent No.: US 8,551,813 B2
(45) Date of Patent: Oct. 8, 2013

(54) WAFER LEVEL IC ASSEMBLY METHOD

(75) Inventors: Chien Hsiun Lee, Hsinchu (TW); Clinton Chao, Hsinchu (TW); Mirng Ji Lii, Hsinchu County (TW); Tjandra Winata Karta, Hsin-Chu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 13/554,580

(22) Filed: Jul. 20, 2012

(65) Prior Publication Data

US 2012/0288998 A1    Nov. 15, 2012

Related U.S. Application Data

(63) Continuation of application No. 12/045,858, filed on Mar. 11, 2008, now Pat. No. 8,247,267.

(51) Int. Cl.
    *H01L 21/00* (2006.01)

(52) U.S. Cl.
    USPC ........... 438/106; 438/107; 438/108; 438/109; 438/121; 438/123; 257/E23.169; 257/687; 257/777

(58) Field of Classification Search
    USPC ........... 438/106–123; 257/687–777, E23.169
    See application file for complete search history.

(56) References Cited

U.S. PATENT DOCUMENTS

| | | | |
|---|---|---|---|
| 4,673,904 A | 6/1987 | Landis | |
| 5,354,955 A | 10/1994 | Gregor et al. | |
| 5,783,870 A | 7/1998 | Mostafazadeh et al. | |
| 5,790,377 A | 8/1998 | Schreiber et al. | |
| 5,909,634 A | 6/1999 | Hotchkiss et al. | |
| 6,026,221 A | 2/2000 | Ellison et al. | |
| 6,136,047 A * | 10/2000 | Karasawa et al. | 29/25.01 |
| 6,264,476 B1 | 7/2001 | Li et al. | |
| 6,417,029 B1 * | 7/2002 | Fjelstad | 438/126 |
| 6,546,620 B1 | 4/2003 | Juskey et al. | |
| 6,608,283 B2 | 8/2003 | Liu et al. | |
| 6,670,819 B2 | 12/2003 | Farnworth et al. | |
| 6,707,162 B1 | 3/2004 | Ho et al. | |
| 6,730,541 B2 | 5/2004 | Heinen et al. | |
| 6,784,543 B2 | 8/2004 | Matsuki et al. | |

(Continued)

FOREIGN PATENT DOCUMENTS

| | | |
|---|---|---|
| CN | 1200647 A | 12/1998 |
| CN | 1451178 A | 10/2003 |
| CN | 1873971 A | 12/2006 |
| CN | 101064247 A | 10/2007 |

*Primary Examiner* — Michael Jung
*Assistant Examiner* — Ankush Singal
(74) *Attorney, Agent, or Firm* — Novak Druce Connolly Bove + Quigg LLP

(57) ABSTRACT

A wafer level integrated circuit assembly method is conducted as follows. First, a mother device wafer with plural first posts is provided. The first posts are used for electrical connection and are made of copper according to an embodiment. Solder is sequentially formed on the first posts. The solder is preferably pre-formed on a wafer, and the locations of the solder correspond to the first posts of the mother device wafer. Consequently, the solder can be formed on or adhered to the first posts by placing the wafer having pre-formed solder onto the first posts. Plural dies having plural second posts corresponding to the first posts are placed onto the mother device wafer. Then, the solder is reflowed to bond the first and second posts, and the mother device wafer is diced.

20 Claims, 8 Drawing Sheets

(56) References Cited

U.S. PATENT DOCUMENTS

| | | |
|---|---|---|
| 6,841,882 B2 | 1/2005 | Chien |
| 6,915,944 B1 | 7/2005 | Takaya et al. |
| 7,019,405 B2 | 3/2006 | Koike et al. |
| 7,077,974 B2 | 7/2006 | Berasi et al. |
| 7,087,458 B2* | 8/2006 | Wang et al. .................... 438/108 |
| 7,098,070 B2 | 8/2006 | Chen et al. |
| 7,122,894 B2 | 10/2006 | Sugimoto et al. |
| 7,190,063 B2* | 3/2007 | Aoyagi .......................... 257/686 |
| 7,241,675 B2* | 7/2007 | Savastiouk et al. ........... 438/597 |
| 7,262,510 B2 | 8/2007 | Chung |
| 7,282,391 B1 | 10/2007 | Andry et al. |
| 7,307,350 B2 | 12/2007 | Ohashi et al. |
| 7,382,049 B2 | 6/2008 | Ho et al. |
| 7,439,098 B2 | 10/2008 | Yang et al. |
| 7,446,384 B2 | 11/2008 | Paik et al. |
| 7,468,551 B2 | 12/2008 | Lin et al. |
| 7,569,935 B1* | 8/2009 | Fan ................................ 257/737 |
| 7,663,232 B2* | 2/2010 | Kinsley .......................... 257/726 |
| 7,829,380 B2* | 11/2010 | Irsigler et al. ................. 438/108 |
| 8,048,479 B2* | 11/2011 | Hedler et al. ................. 427/96.1 |
| 2002/0089836 A1 | 7/2002 | Ishida et al. |
| 2002/0167085 A1* | 11/2002 | Ohuchi et al. ................. 257/750 |
| 2003/0092219 A1 | 5/2003 | Ohuchi et al. |
| 2004/0046263 A1 | 3/2004 | Harper et al. |
| 2004/0084210 A1 | 5/2004 | Dishongh et al. |
| 2004/0087057 A1* | 5/2004 | Wang et al. .................... 438/106 |
| 2004/0238491 A1 | 12/2004 | Berasi et al. |
| 2004/0262778 A1 | 12/2004 | Hua |
| 2004/0263290 A1 | 12/2004 | Sherrer et al. |
| 2005/0085016 A1 | 4/2005 | McWilliams et al. |
| 2005/0110158 A1 | 5/2005 | Aoyagi |
| 2005/0156280 A1* | 7/2005 | Patel et al. .................... 257/532 |
| 2005/0194695 A1* | 9/2005 | Lin et al. ....................... 257/777 |
| 2005/0218195 A1 | 10/2005 | Wilson et al. |
| 2006/0057833 A1 | 3/2006 | Kim et al. |
| 2006/0071340 A1* | 4/2006 | Zhong et al. .................. 257/762 |
| 2006/0267176 A1* | 11/2006 | Offrein et al. ................. 257/691 |
| 2006/0278979 A1* | 12/2006 | Rangel .......................... 257/734 |
| 2007/0152328 A1 | 7/2007 | Jadhav et al. |
| 2007/0170592 A1 | 7/2007 | Key et al. |
| 2007/0181992 A1 | 8/2007 | Lake |
| 2007/0254456 A1 | 11/2007 | Maruyama et al. |
| 2007/0292072 A1 | 12/2007 | Ramirez et al. |
| 2008/0036071 A1 | 2/2008 | Li et al. |
| 2008/0099925 A1 | 5/2008 | Irsigler et al. |
| 2008/0105558 A1 | 5/2008 | Cohen et al. |
| 2008/0157316 A1 | 7/2008 | Yang |
| 2008/0240656 A1 | 10/2008 | Rollin et al. |
| 2008/0274589 A1* | 11/2008 | Lee et al. ....................... 438/108 |
| 2009/0072385 A1 | 3/2009 | Alley et al. |
| 2009/0091024 A1 | 4/2009 | Zeng et al. |
| 2010/0084755 A1* | 4/2010 | Gerber et al. ................. 257/690 |

* cited by examiner

WAFER LEVEL IC ASSEMBLY METHOD

CROSS-REFERENCE TO RELATED APPLICATIONS

This application is a continuation of U.S. application Ser. No. 12/045,858, filed Mar. 11, 2008.

BACKGROUND OF THE INVENTION (A) Field of the Invention

The present invention relates to an integrated circuit (IC) assembly method, and more specifically, to an IC assembly method regarding wafer-level packaging.

(B) Description of Related Art

Wafer-Level Packaging (WLP) refers to the technology of packaging an integrated circuit at wafer level, instead of the traditional process of assembling the package of each individual unit after wafer dicing. WLP is essentially a true chip-scale packaging (CSP) technology, since the resulting package is practically of the same size as the die. Furthermore, wafer-level packaging paves the way for true integration of wafer fab, packaging, test, and burn-in at wafer level, for the ultimate streamlining of the manufacturing process undergone by a device from the start to customer shipment.

Wafer-level packaging basically consists of extending the wafer fab processes to include device interconnection and device protection processes. However, there is no single industry-standard method of doing this at present. Generally, there are many WLP technology classifications in existence today.

Encapsulated Copper Post technology is one of the WLP technologies. The chip's bond pads are also rerouted into an area array of interconnection points. In this technology, however, the interconnection points are in the form of electroplated copper posts, instead of pads.

These copper posts provide enough stand-off for the active wafer surface to be encapsulated in low-stress epoxy by transfer molding, exposing only the top portions of the posts for bonding.

The conventional copper-to-copper post bonding uses thermal bonding technology like hot press, in which the key factors include temperature, time and pressure. As shown in FIGS. 1 and 2, the dies 11 with copper posts 12 are placed upside down, and the copper posts 12 are aligned with the copper posts 13 of a mother device wafer 14. The copper to posts 12 and 13 are bonded together in an environment of a temperature higher than the melting point of copper by solid state diffusion. However, the melting point of copper is very high (greater than 1000° C.), and therefore, bonding takes a long time. As usual, it takes around 20 to 30 seconds for each die bonding. In addition, the breakage of wafers or dies may occur due to compression of bonding, and high yield loss may occur due to copper-to-copper post misalignment. Another shortcoming is that the process is very costly because the equipment is complicated and expensive.

SUMMARY OF THE INVENTION

These and other problems are generally solved or circumvented, and technical advantages are generally achieved, by advantageous embodiments of the present invention, which provides a wafer level IC assembly method that can considerably shorten the processing time and further reduce the manufacturing cost.

In an embodiment of the present invention, the integrated circuit assembly method is conducted as follows. First, a mother device wafer with plural first posts is provided. The first posts are used for electrical connection, and are made of copper according to this embodiment. Solder is formed sequentially on the first posts. The solder is preferably pre-formed on a wafer, and the locations of the solder correspond to the first posts of the mother device wafer. Consequently, the solder can be formed on or adhered to the first posts by placing the wafer having pre-formed solder onto the mother device wafer after alignment. Plural dies having plural second posts corresponding to the first posts are placed onto the mother device wafer. Then, the solder is reflowed to bond the first and second posts, and the mother device wafer is diced.

The solder is preferably reflowed in an atmosphere having a reducing agent like hydrogen, so that the solder is reduced in the reflowing process to bond the first and second posts. Alternatively, an underfill material having a reducing agent is formed on the mother device wafer first, so that the solder can be reduced by the reducing agent during reflowing so as to bond the first and second posts.

The pre-formed solder wafer can form solder on all of the first posts of the mother device wafer at one time, and the reflowing or bonding temperature can be tremendously decreased. Consequently, the processing time is significantly decreased, thereby reducing the processing cost.

The foregoing has outlined rather broadly the features and technical advantages of the present invention in order that the detailed description of the invention that follows can be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the purposes of the present invention. It should also be realized by those skilled in the art that such equivalent constructions do not depart from the spirit and scope of the invention as set forth in the appended claims.

BRIEF DESCRIPTION OF THE DRAWINGS

The advantages of the present invention will become apparent upon reading the following description and upon reference to the accompanying drawings in which.

DETAILED DESCRIPTION OF THE INVENTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, an IC assembly process. The principles of the present invention, however, may also be applied to other semiconductor devices of like construction and integrated circuits in general.

Embodiments of the present invention provide methods for decreasing the processing time of wafer level IC assembly. Embodiments of the present invention are described by referring to introducing solder as joining material. A specific process and material are disclosed; however, it should be appreciated by one of ordinary skill in the art that other, equivalent processes and materials may be used.

FIGS. 3 through 8 show a first embodiment of the IC assembly process employing a forming gas (no flux).

Figure 1:
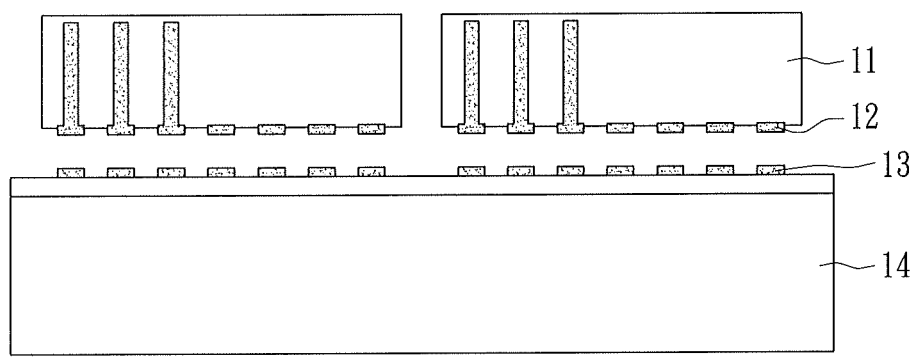
FIGS. 1 and 2 show a known wafer level IC assembly method.
Figure 2:
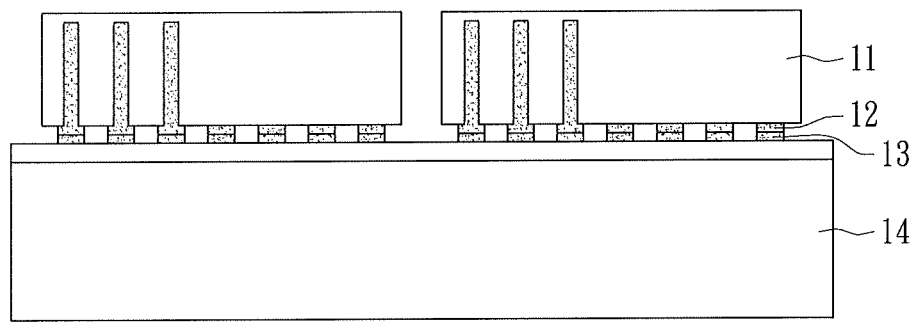
Figure 3:
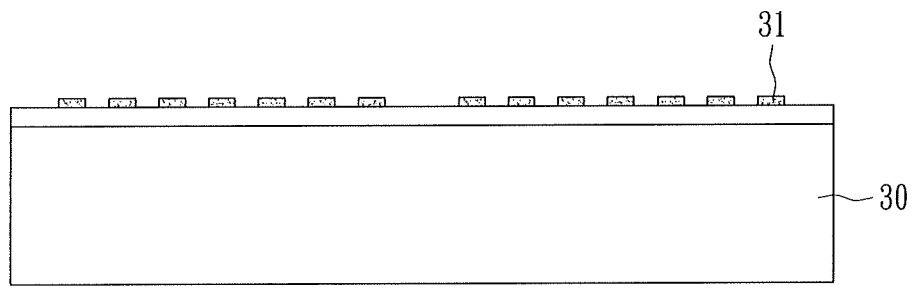
FIGS. 3 through 8 show an IC assembly method in accordance with the first embodiment of the present invention.
Figure 4:
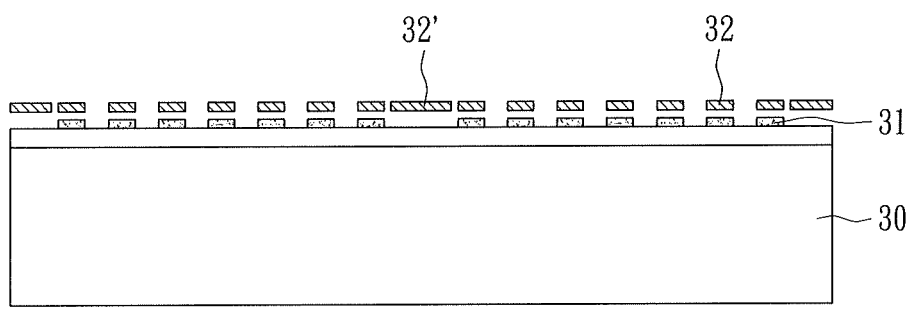

In FIG. 3, a mother device wafer 30 is provided with a plurality of posts 31 for bonding. In FIG. 4, solder 32 is formed on the posts 31. The solder 32 may be comprised of tin, tin-lead (SnPb) eutectic, lead-free to materials or the like. It should be appreciated by one of ordinary skill in the art that other, equivalent materials may be employed. In an embodiment, the solder 32 is formed on the posts 31 by a medium such as a wafer or a wafer-shaped disc. Based on the shape of the medium, solder 32', in addition to the solder 32, may be formed also.

Figure 5:
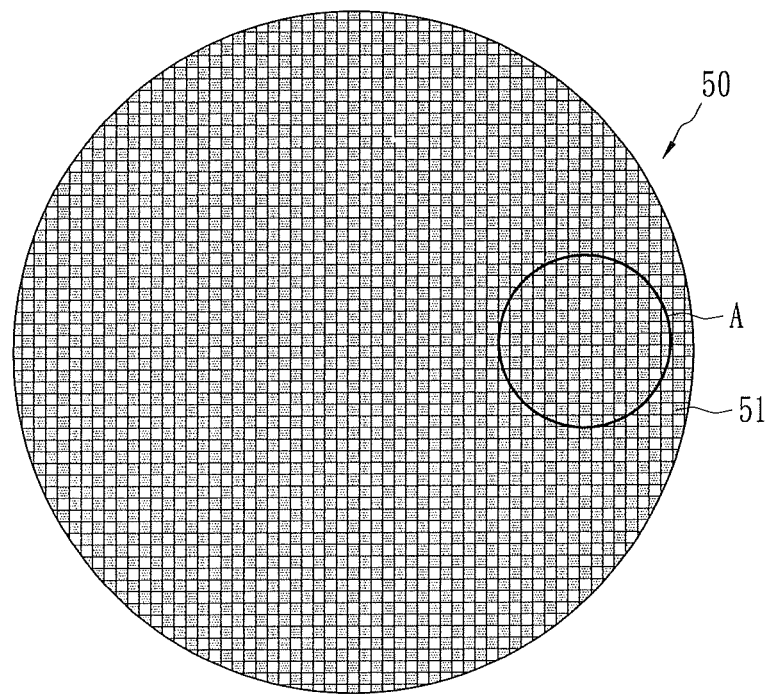
Figure 6:
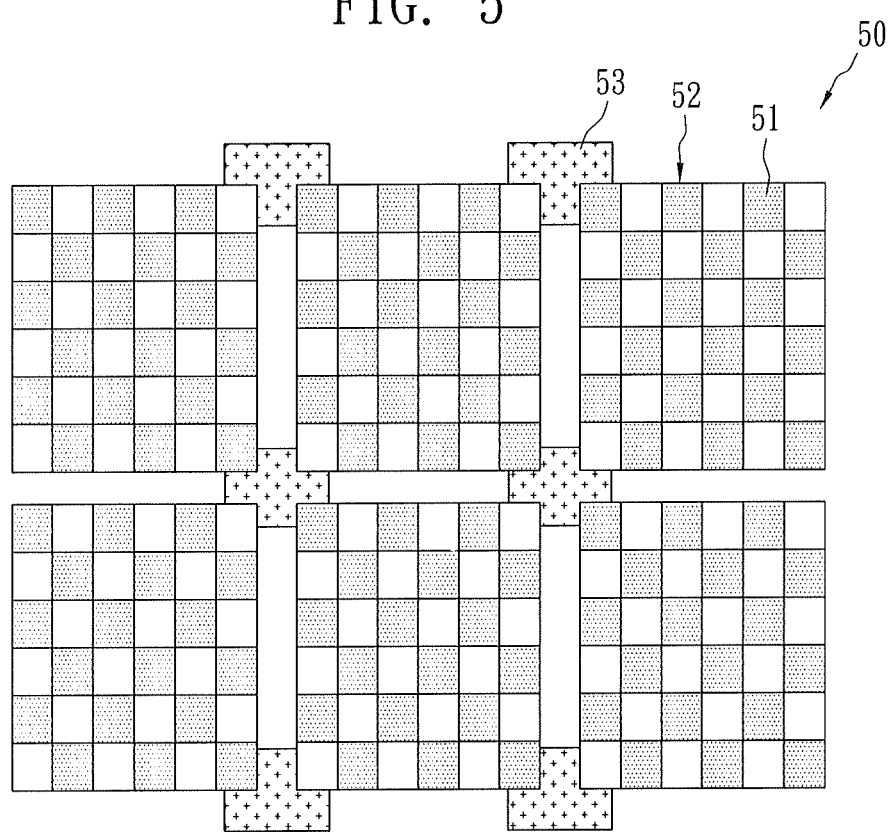

FIG. 5 illustrates a wafer or a wafer-shaped disc for pre-forming solder, and FIG. 6 is a magnification view of area "A" of FIG. 5. A pre-form solder wafer 50 includes solder 51 thereon, and the locations of the solder 51 correspond to the posts 31 of the mother device wafer 30. Accordingly, the pre-form solder wafer 50 is upside down and placed onto the mother device wafer 30 after alignment, so that the solder 51 can be in contact with and adhered to all of the posts 31 to form the solder 32 at one time. In other words, the pattern of the solder 51 of the pre-form solder wafer 50 is transferred to the mother device wafer 30 to form the solder 32 on the posts 31. More specifically, the distribution of the solder 51 correspond to the dies of the mother device wafer 30. Rectangular areas 52 having distributed solder 51 correspond to the dies of the mother device wafer 30. The connections 53 between rectangular areas 52 are electrical connecting paths for solder plating. Consequently, the solder 32' corresponding to the connections 53 is also formed as shown in FIG. 4.

The pre-form solder wafer 50 may be a wafer with a release film, such as a molybdenum (Mo) layer, and a seed metal layer thereon. On the seed layer, photoresist may be formed as a mask, and then the solder 51 is plated on the area not covered by the photoresist. The photoresist is removed later, thereby the solder 51 with a pattern is accordingly formed. Moreover, the pre-form solder wafer 50 may be a wafer with a release film, such as a Mo layer, and the solder 51 is patterned on the Mo layer by a mask through evaporation. The release film can help to remove the wafer and leave the solders 32 and 32' adhered to the posts 31 easily. Such members to support the solder 51, i.e., the source to form the solders 32 and 32', are omitted in FIG. 4 for drawing clarity consideration.

In the above-mentioned embodiment, the solder 32 is preferably pre-formed on a wafer or a wafer-shaped disc, and the locations of the solder 32 correspond to the posts 31 of the mother device wafer 30, i.e., the solder pattern on the wafer corresponds to the layout of the posts of the mother device wafer. Given the fact that the pre-form solder wafer is aligned with and contacts the mother device wafer, the solder can be adhered to the posts of the mother device wafer.

Figure 7:
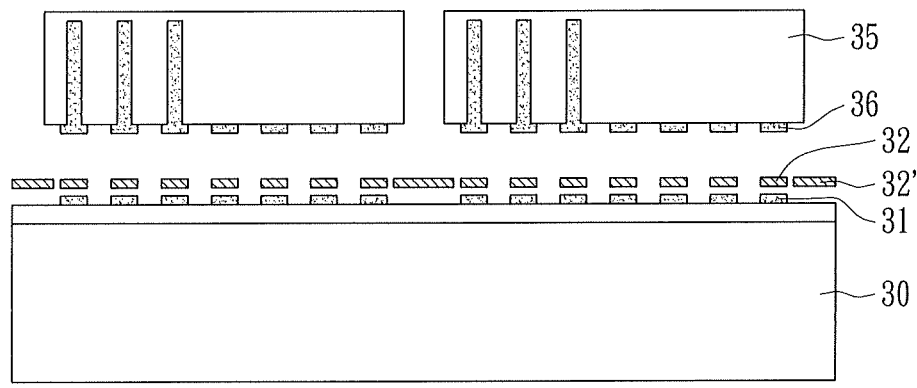
Figure 8:
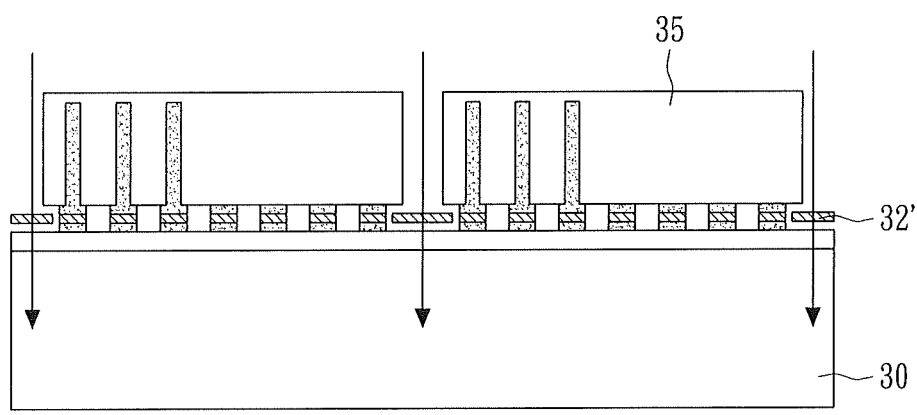

In FIGS. 7 and 8, a plurality of diced dies 35 are bonded to the mother device wafer 30 with solder 32 pre-formed thereon. More specifically, the posts 36 of the dies 35 are bonded to the posts 31 of the mother device wafer 30. In this embodiment, the first and second posts 31 and 36 are copper posts. The dies 35 and mother device wafer 30 are subjected to a reflow process at a temperature higher than the melting point of the solder 32, and preferably, the reflow temperature is higher than the melting temperature of the solder 32 by 30° C. In a preferred embodiment, the reflowing process is performed in a vacuum environment below 2 torr, and preferably below 0.5 torr, and forming gas is introduced during the reflowing process. The forming gas contains a reduction gas to reduce the solder for bonding. In an embodiment, the forming gas comprises a mixture of nitrogen and hydrogen, or hydrogen only. In an embodiment, there are 15% hydrogen and 85% nitrogen, and the ratio of hydrogen to nitrogen is preferably between 0.1 and 0.25. The mother device wafer 30 is sequentially diced, and as a consequence the connecting solder 32' is separated.

FIGS. 9 through 12 show a second embodiment of the IC assembly process employing underfill material having a reducing agent.

Figure 9:
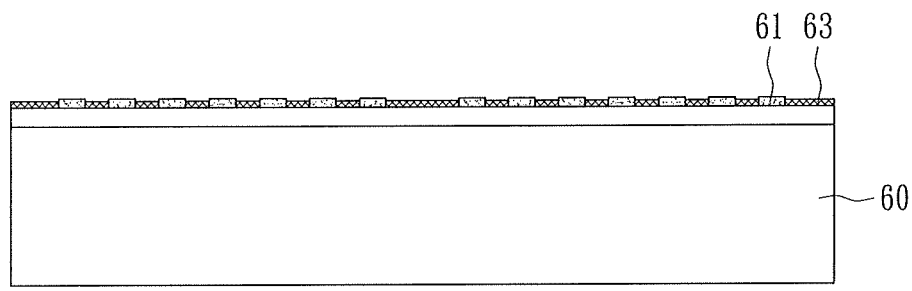
FIGS. 9 through 12 show another IC assembly method in accordance with the second embodiment of the present invention.
Figure 10:
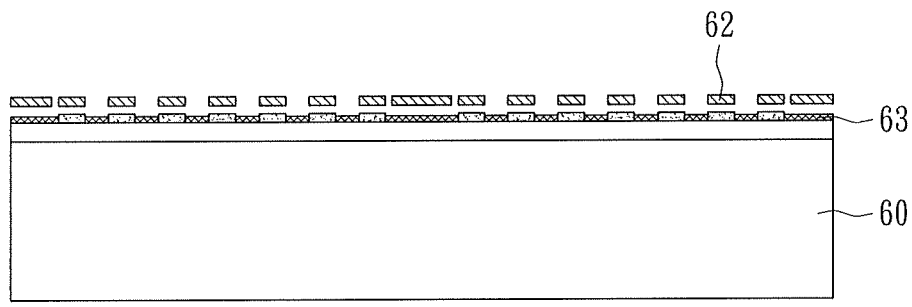
Figure 11:
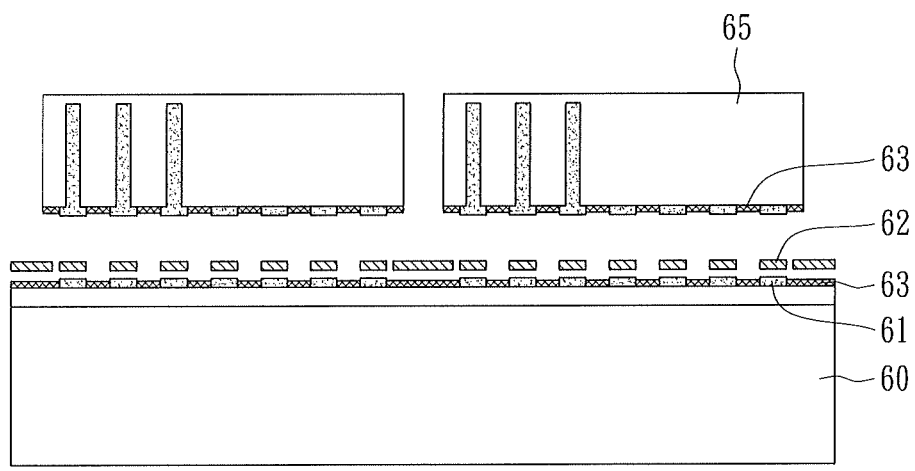
Figure 12:
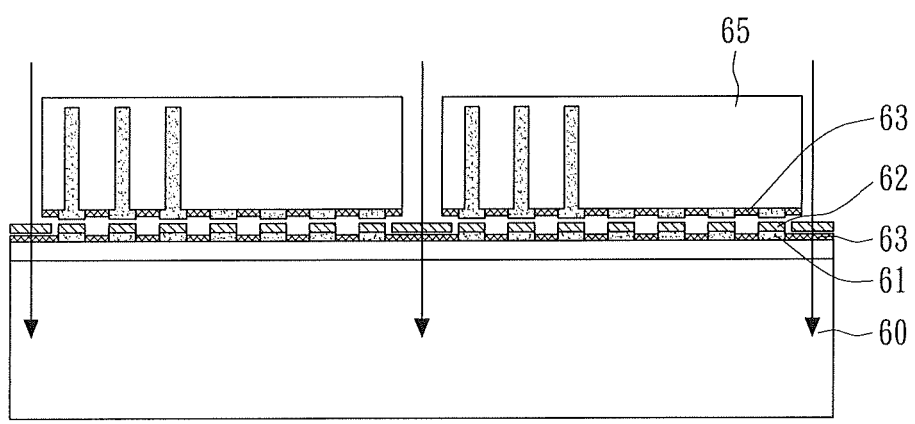

In FIG. 9, the no-flow or colloidal underfill material 63 is formed or printed on a mother device wafer 60 having posts 61. In FIG. 10, solder 62 is formed on the posts 61 of the mother device wafer 60 after alignment. Likewise, the solder 62 may be comprised of Sn, SnPb eutectic or lead-free materials, and the solder 62 is preferably pre-formed as given in the description of FIGS. 5 and 6. In FIGS. 11 and 12, a plurality of diced dies 65 are bonded to the mother device wafer 60 with solder 62 thereon. In an embodiment, no-flow underfill material 63 can be further formed or printed on a device wafer, and the printed device wafer is diced into the dies 65 after being cured at a temperature of 220° C. for five minutes. As a result, the dies 65 also have the underfill material 63 on the surface. The combined dies 65 and the mother device wafer 60 are subjected to a reflow process at a temperature higher than the melting point of the solder material, and the reflow temperature is preferably higher than the melting temperature by 30° C. The mother device wafer 60 is sequentially diced, by which the pre-formed solder between dies is separated.

The underfill material 63 is typically a polymeric material, such as an epoxy or an acrylic resin, and has a thermal coefficient of expansion that approximates that of the die 65 to help minimize stress during the operation of the die caused by the heating of the underfill material 63. To promote filling of the gap between the posts 61, the viscosity of the underfill material 63 is taken into account. In a preferred embodiment, the reducing agent in the underfill material comprises abietic resin.

Figure 13:
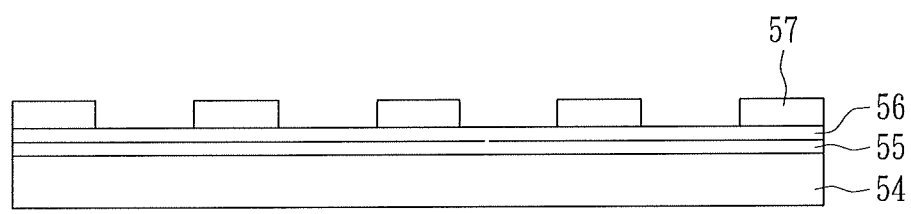
FIGS. 13 and 14 show a method for making a pre-form solder wafer in accordance with a first embodiment of the present invention.
Figure 14:
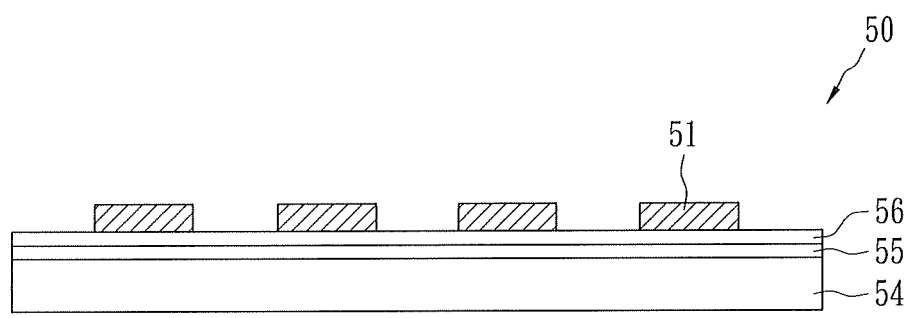

FIGS. 13 and 14 show an embodiment employing plating technology to prepare the pre-form solder wafer 50 as shown in FIGS. 5 and 6. In FIG. 13, a release film, such as a molybdenum (Mo) layer 55, is sputtered onto a wafer 54, and copper is sputtered as a seed metal layer 56 afterwards. In the present embodiment, the Mo layer 55 is of a thickness of around 1 micrometer, and the seed metal layer 56 is of a thickness of around 5000 angstroms. The wafer 54 is subjected to a photo process to form photoresist 57 patterning plating and non-plating areas, and then the solder 51 such as tin-silver (Sn—Ag) eutectic is plated on the plating areas, i.e., the area not covered by the photoresist 57. The photoresist 57 is stripped afterwards to form the pre-formed solder wafer 50 as shown in FIG. 14.

Figure 15:
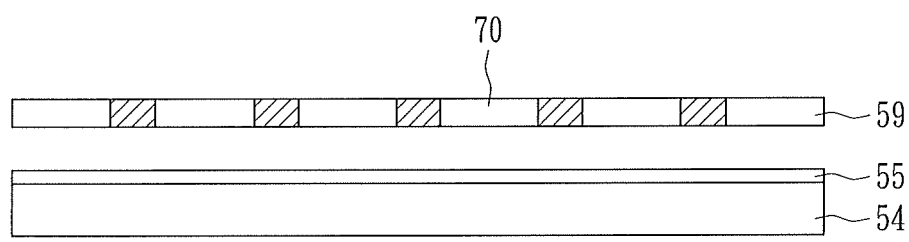
FIGS. 15 and 16 show a method for making a pre-form solder wafer in accordance with a second embodiment of the present invention.
Figure 16:
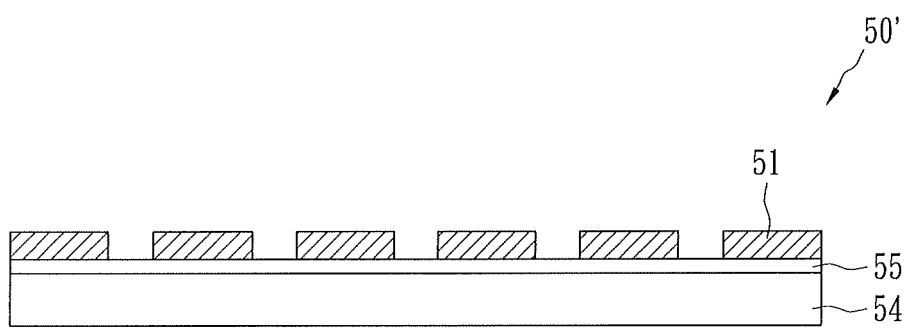

FIGS. 15 and 16 show another embodiment for preparing the pre-form solder wafer. A release film mask, such as a Mo material mask 59, having plural holes 70 is prepared for solder material evaporation, and a release film, such as a Mo layer 55, is sputtered onto the wafer 54 to form a Mo sputtered wafer. The Mo material mask 59 is placed on the Mo sputtered wafer, and then solder material is evaporated onto the Mo sputtered wafer through the plural holes 70 to form the solder 51, thereby forming the pre-form solder wafer 50'. The locations of the holes 70 correspond to the copper posts of the mother device wafer. In this embodiment, the thickness of the solder 51 is between 10 and 50 micrometers.

In accordance with the present invention, the pre-formed solder wafer is introduced to form solder as joining material on all of the copper posts of the mother device wafer at one time, and consequently the processing time is significantly decreased. Moreover, the present method does not need compression while bonding, the wafer breakage issue can be effectively resolved, and thus, the yield can be improved.

The present invention will be described with respect to preferred embodiments in a specific context, namely, an IC assembly method. The principles of the present invention, however, may also be applied to other semiconductor devices of like construction and integrated circuits, in general.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

What is claimed is:

1. An integrated circuit assembly method, comprising:
providing a device wafer with plural first posts;
forming underfill material comprising a reducing agent around the first posts of the device wafer, wherein the underfill material does not come in contact with the top surface of the first posts;
forming solder on the first posts by placing a wafer with a release film having solder thereon to contact the first posts, and then removing the wafer and the release film to leave the solder adhered to the first posts, wherein the release film is made of molybdenum;
placing a plurality of dies onto the device wafer, wherein the dies comprise plural second posts corresponding to the first posts, wherein the first posts extend above a substrate surface of the device wafer without voids in the substrate surface surrounding the posts;
reflowing the solder to bond the first and second posts; and
dicing the device wafer.

2. The integrated circuit assembly method of claim 1, wherein reflowing the solder comprises reduction of the solder.

3. The integrated circuit assembly method of claim 1, wherein reflowing the solder is performed in an atmosphere comprising a reducing agent.

4. The integrated circuit assembly method of claim 1, wherein reflowing the solder is performed at a temperature higher than the melting point of the solder by 30° C.

5. The integrated circuit assembly method of claim 1, wherein reflowing the solder is performed in a vacuum environment less than 2 torr.

6. The integrated circuit assembly method of claim 1, wherein the wafer having soldering is formed by evaporation or plating.

7. The integrated circuit assembly method of claim 1, wherein the solder comprises tin or tin-lead eutectic.

8. The integrated circuit assembly method of claim 1, wherein the reducing agent comprises abietic resin.

9. The integrated circuit assembly method of claim 3, wherein the atmosphere comprises hydrogen or a mixture of hydrogen and nitrogen.

10. An integrated circuit assembly method, comprising:
providing a device wafer with plural first posts;
forming underfill material comprising a reducing agent around the first posts of the device wafer, wherein the underfill material does not come in contact with the top surface of the first posts;
forming solder on the first posts;
placing a plurality of dies onto the device wafer, wherein the dies comprise plural second copper posts corresponding to the first posts;
reflowing the solder in an atmosphere comprising a reducing agent to bond the first posts and the second copper posts; and
dicing the device wafer.

11. The integrated circuit assembly method of claim 10, wherein the atmosphere comprises hydrogen or a mixture of hydrogen and nitrogen.

12. The integrated circuit assembly method of claim 10, wherein reflowing the solder is performed at a temperature higher than the melting point of the solder by 30° C.

13. The integrated circuit assembly method of claim 10, wherein forming solder on the first posts is performed by placing a wafer having solder onto the first posts, and then removing the wafer.

14. The integrated circuit assembly method of claim 10, wherein the solder comprises tin or tin-lead eutectic.

15. An integrated circuit assembly method, comprising:
providing a device wafer with plural first copper posts;
forming underfill material comprising a reducing agent around the first copper posts of the device wafer, wherein the underfill material does not come in contact with the top surface of the first copper posts;
forming solder on the first copper posts;
placing a plurality of dies onto the device wafer, wherein the dies comprise plural second copper posts corresponding to the first copper posts;
reflowing the solder in an atmosphere comprising a reducing agent to bond the first copper posts and the second copper posts; and
dicing the device wafer.

16. The integrated circuit assembly method of claim 15, wherein the atmosphere comprises hydrogen or a mixture of hydrogen and nitrogen.

17. The integrated circuit assembly method of claim 15, wherein reflowing the solder is performed at a temperature higher than the melting point of the solder by 30° C.

18. The integrated circuit assembly method of claim 15, wherein forming solder on the first copper posts is performed by placing a wafer having solder onto the first copper posts, and then removing the wafer.

19. The integrated circuit assembly method of claim 15, wherein the solder comprises tin or tin-lead eutectic.

20. The integrated circuit assembly method of claim 15, wherein the reducing agent comprises abietic resin.

\* \* \* \* \*